(12) United States Patent
Lee

(10) Patent No.: US 11,583,948 B2
(45) Date of Patent: Feb. 21, 2023

(54) SOLDER MEMBER MOUNTING SYSTEM

(71) Applicant: SAMSUNG ELECTRONICS CO., LTD., Suwon-si (KR)

(72) Inventor: Soo-Hwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/589,925

(22) Filed: Feb. 1, 2022

(65) Prior Publication Data

US 2022/0152718 A1 May 19, 2022

Related U.S. Application Data

(63) Continuation of application No. 16/381,171, filed on Apr. 11, 2019, now Pat. No. 11,278,979.

(30) Foreign Application Priority Data

Oct. 5, 2018 (KR) .......................... 10-2018-0119255

(51) Int. Cl.
*B23K 3/00* (2006.01)
*B23K 3/06* (2006.01)
(Continued)

(52) U.S. Cl.
CPC ............ *B23K 3/0623* (2013.01); *B23K 1/008* (2013.01); *H01L 21/4853* (2013.01);
(Continued)

(58) Field of Classification Search
CPC .. B23K 3/0623; B23K 1/008; B23K 2101/40; B23K 1/0016; B23K 3/0607; H01L 21/4853; H01L 24/75; H01L 24/81; H01L 2224/75621; H01L 2224/81024; H01L 2224/81136; H01L 2224/81815; H01L 24/13; H01L 24/11; H01L 2224/03828;
(Continued)

(56) References Cited

U.S. PATENT DOCUMENTS 4,139,138 A 2/1979 Besselman, Jr.
4,421,266 A 12/1983 Bock
(Continued)

FOREIGN PATENT DOCUMENTS

KR 10-1999-0055886 A 7/1999
KR 10-2005-0012506 A 2/2005
(Continued)

OTHER PUBLICATIONS

Korean Office action dated Oct. 6, 2022 for corresponding Korean application: KR 10-2018-0119255.

*Primary Examiner* — Kiley S Stoner
(74) *Attorney, Agent, or Firm* — Lee IP Law, P.C.

(57) ABSTRACT

A solder member mounting method includes providing a substrate having bonding pads formed thereon, detecting a pattern interval of the bonding pads, selecting one of solder member attachers having different pattern intervals from each other, such that the one selected solder member attacher of the solder member attachers has a pattern interval corresponding to the detected pattern interval of the bonding pads, and attaching solder members on the bonding pads of the substrate, respectively, using the one selected solder member attacher.

10 Claims, 20 Drawing Sheets

(51) Int. Cl.
*H01L 23/00* (2006.01)
*H01L 21/48* (2006.01)
*H05K 1/11* (2006.01)
*H05K 3/40* (2006.01)
*B23K 1/008* (2006.01)
*B23K 101/40* (2006.01)

(52) U.S. Cl.
CPC .............. *H01L 24/75* (2013.01); *H01L 24/81* (2013.01); *H05K 1/111* (2013.01); *H05K 3/4007* (2013.01); *B23K 2101/40* (2018.08); *H01L 2224/75621* (2013.01); *H01L 2224/81024* (2013.01); *H01L 2224/81136* (2013.01); *H01L 2224/81815* (2013.01); *H05K 2201/10734* (2013.01); *H05K 2203/163* (2013.01)

(58) Field of Classification Search
CPC ... H01L 2224/1132; H01L 2224/11332; H01L 2224/11849; H01L 24/742; H01L 23/49816; H01L 2224/11005; H01L 2224/131; H01L 2224/13294; H01L 2224/133; H05K 1/111; H05K 3/4007; H05K 2201/10734; H05K 2203/163; H05K 3/3485; H05K 3/3489; H05K 2203/085; H05K 3/3436; H05K 3/3478; H05K 3/341; H05K 2203/04; H05K 3/3494; Y02P 70/50

See application file for complete search history.

(56) References Cited

U.S. PATENT DOCUMENTS

| | | | |
|---|---|---|---|
| 5,676,305 A | 10/1997 | Potter et al. | |
| 5,695,667 A | 12/1997 | Eguchi et al. | |
| 5,749,614 A * | 5/1998 | Reid | H05K 3/3478 414/627 |
| 5,816,481 A | 10/1998 | Economy et al. | |
| 5,834,062 A | 11/1998 | Johnson et al. | |
| 6,193,132 B1 | 2/2001 | Shibata et al. | |
| 6,225,702 B1 * | 5/2001 | Nakamura | H01L 23/49838 257/E23.079 |
| 6,317,513 B2 | 11/2001 | Michael et al. | |
| 6,460,755 B1 * | 10/2002 | Inoue | B23K 3/0623 228/41 |
| 6,607,117 B1 | 8/2003 | Kang et al. | |
| 7,112,889 B1 * | 9/2006 | Maruyama | H01L 24/97 451/388 |
| 7,506,792 B1 | 3/2009 | Manfroy et al. | |
| 7,507,655 B2 | 3/2009 | Sakaguchi et al. | |
| 8,671,561 B2 * | 3/2014 | Iida | H05K 3/3478 29/840 |
| 8,799,845 B2 | 8/2014 | Scanlan et al. | |
| 9,579,741 B2 | 2/2017 | An | |
| 10,418,292 B2 * | 9/2019 | Muto | G01R 1/0483 |
| 10,892,240 B2 * | 1/2021 | Niwa | B23K 1/203 |
| 2001/0008249 A1 * | 7/2001 | Hertz | B23K 3/0623 29/842 |
| 2002/0084315 A1 | 7/2002 | Mackay et al. | |
| 2003/0175599 A1 | 9/2003 | Voustas et al. | |
| 2004/0031406 A1 | 2/2004 | Otake et al. | |
| 2004/0035306 A1 | 2/2004 | Onishi et al. | |
| 2005/0035182 A1 * | 2/2005 | Mano | B23K 3/0607 228/41 |
| 2005/0077340 A1 * | 4/2005 | Nagafuku | H05K 13/0465 228/8 |
| 2005/0087886 A1 | 4/2005 | Leinbach | |
| 2005/0133573 A1 | 6/2005 | Bayot | |
| 2005/0232728 A1 | 10/2005 | Rice et al. | |
| 2007/0052112 A1 * | 3/2007 | Bauer | B23K 3/0623 257/E25.023 |
| 2007/0102478 A1 | 5/2007 | Prince | |
| 2008/0048009 A1 | 2/2008 | Maeda et al. | |
| 2008/0054047 A1 | 3/2008 | Joma et al. | |
| 2008/0182398 A1 | 7/2008 | Carpenter et al. | |
| 2008/0197170 A1 | 8/2008 | Prince | |
| 2009/0108053 A1 * | 4/2009 | Huddleston | H01L 24/742 228/41 |
| 2009/0122306 A1 | 5/2009 | Ohashi et al. | |
| 2009/0294516 A1 * | 12/2009 | Sawa | H05K 3/3478 228/41 |
| 2010/0051671 A1 * | 3/2010 | Ling | B23K 3/0623 228/103 |
| 2012/0006364 A1 | 1/2012 | Kim | |
| 2014/0001241 A1 * | 1/2014 | Igarashi | B23K 3/082 228/9 |
| 2014/0151437 A1 * | 6/2014 | Choi | H01L 24/81 228/8 |
| 2014/0242753 A1 | 8/2014 | Yeo et al. | |
| 2014/0361782 A1 * | 12/2014 | Kurosawa | G01N 21/956 324/501 |
| 2015/0231723 A1 | 8/2015 | An | |
| 2015/0287788 A1 | 10/2015 | Eliam et al. | |
| 2016/0035696 A1 | 2/2016 | Tao | |
| 2016/0172324 A1 * | 6/2016 | Kuczynski | B23K 1/0016 228/9 |
| 2017/0257951 A1 | 9/2017 | Bergström | |
| 2017/0261455 A1 | 9/2017 | Paik et al. | |
| 2018/0005972 A1 | 1/2018 | Hossain et al. | |
| 2018/0049356 A1 * | 2/2018 | Mori | G01N 21/95684 |
| 2018/0090424 A1 * | 3/2018 | Betsui | H01L 23/49833 |
| 2018/0277449 A1 * | 9/2018 | Muto | G01R 1/0483 |
| 2019/0267346 A1 | 8/2019 | Hsu et al. | |
| 2019/0275600 A1 | 9/2019 | Hsu et al. | |
| 2019/0295976 A1 | 9/2019 | Niwa | |
| 2019/0378815 A1 | 12/2019 | Heikkinen et al. | |
| 2020/0120796 A1 | 4/2020 | Awaji | |
| 2020/0331062 A1 | 10/2020 | Coates et al. | |

FOREIGN PATENT DOCUMENTS

| | | |
|---|---|---|
| KR | 10-2006-0016939 A | 2/2006 |
| KR | 10-2014-0013594 A | 2/2014 |
| KR | 10-1371332 B1 | 3/2014 |
| KR | 10-2015-0097841 A | 8/2015 |

* cited by examiner

SOLDER MEMBER MOUNTING SYSTEM

CROSS-REFERENCE TO RELATED APPLICATION

This is a continuation of U.S. patent application Ser. No. 16/381,171 filed Apr. 11, 2019, which is incorporated by reference herein in its entirety.

Korean Patent Application No. 10-2018-0119255, filed on Oct. 5, 2018, in the Korean Intellectual Property Office (KIPO), and entitled: "Solder Member Mounting Method and System," is incorporated by reference herein in its entirety.

BACKGROUND

1. Field

Example embodiments relate to a solder member mounting method and system. More particularly, example embodiments relate to a solder member mounting method of mounting solder balls on bonding pads of a substrate at once and a solder member mounting system for performing the same.

2. Description of the Related Art

In a surface mount technology (SMT) process for mounting an electronic product on a substrate, e.g., a printed circuit board (PCB), a solder member, e.g., a solder ball, may be used to mechanically and electrically connect the electronic product and the substrate to each other. For example, the solder balls may be mounted on bonding pads of the substrate followed by mounting the electronic product on the solder balls.

SUMMARY

According to example embodiments, in a solder member mounting method, a substrate having bonding pads formed thereon is provided. A pattern interval of the bonding pads is detected. One is selected from solder member attachers having different pattern intervals is selected, the pattern interval of the selected solder member attacher corresponding to the detected pattern interval. Solder members are attached on the bonding pads of the substrate respectively, using the selected solder member attacher.

According to example embodiments, in a solder member mounting method, a substrate having bonding pads formed thereon is provided. A plurality of allowable error ranges is determined such that an actual pattern interval of the bonding pads falls within one of the allowable error ranges. Solder member attachers having different pattern intervals are provided, the pattern intervals corresponding to the allowable error ranges respectively. The actual pattern interval of the bonding pads is detected. Solder members are attached on the bonding pads of the substrate respectively, using the solder member attacher having the pattern interval corresponding to the detected pattern interval.

According to example embodiments, a solder member mounting system includes a substrate transferring stage configured to transfer and support a substrate having bonding pads formed thereon, a pattern recognition apparatus configured to detect a pattern interval of the bonding pads, and a solder member attaching apparatus including a plurality of solder member attachers having different pattern intervals and configured to provide one selected from the solder member attachers, the pattern interval of the selected solder member attacher corresponding to the detected pattern interval.

According to example embodiments, a solder member mounting system may include a pattern recognition apparatus configured to recognize an actual pattern interval of bonding pads of a substrate, which varies according to thermal processes previously performed on the substrate. The solder member mounting system may include a flux coating apparatus having a plurality of flux coaters with different pattern intervals and a solder member attaching apparatus having a plurality of solder member attachers with different pattern intervals. One of the flux coaters corresponding to the actual pattern interval may be selected and one of the solder member attachers corresponding to the actual pattern interval may be selected to form flux and solder balls on the bonding pads of the substrate.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be explained in detail with reference to the accompanying drawings.

Figure 1:
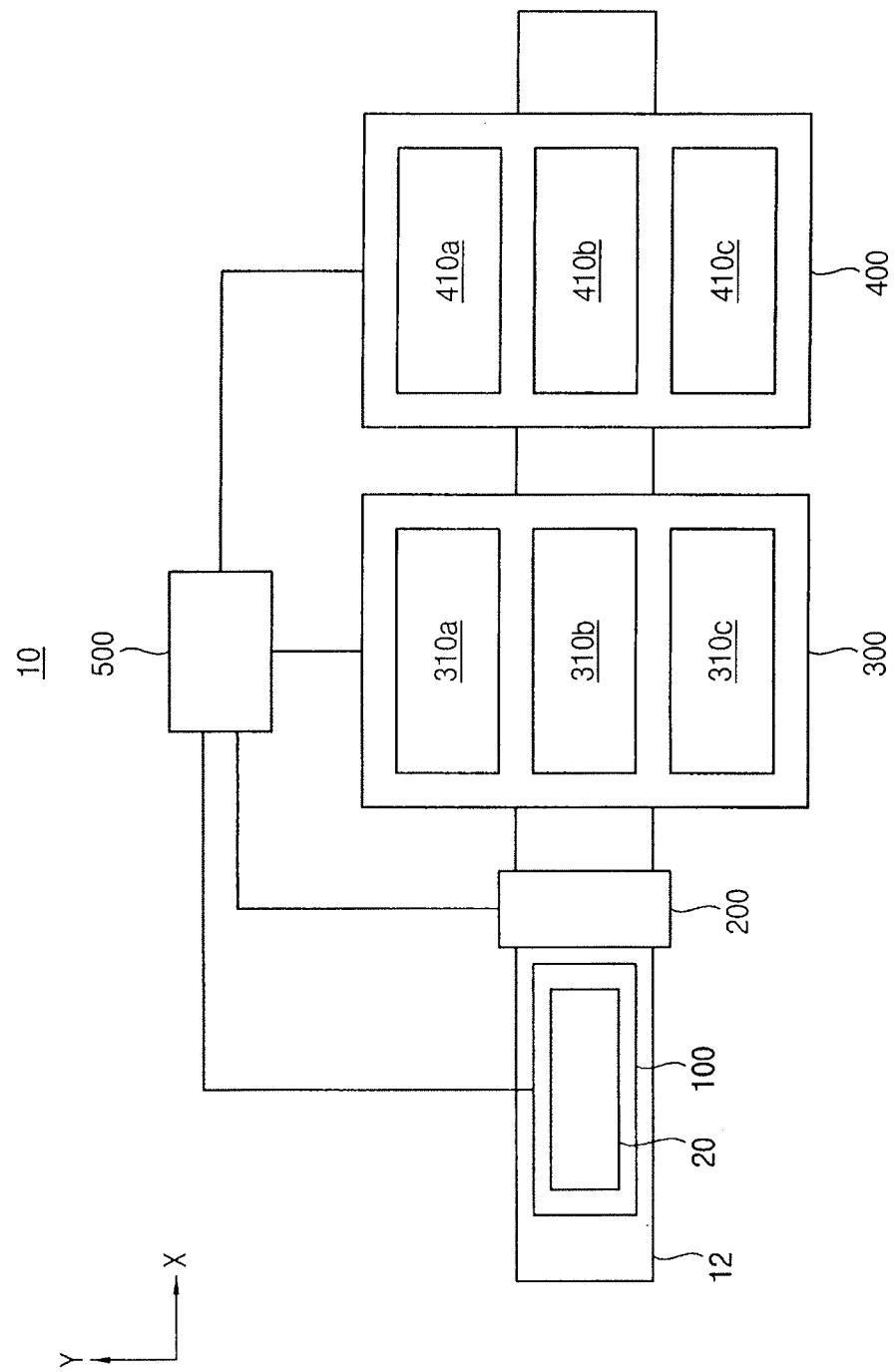
FIG. 1 illustrates a block diagram of a solder member mounting system in accordance with example embodiments.
Figure 2:
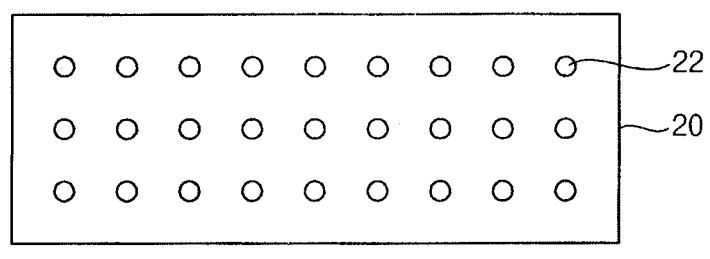
FIG. 2 illustrates a plan view of a substrate including bonding pads on which solder members are mounted by the solder member mounting system in FIG. 1.
Figure 2:
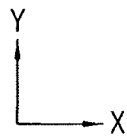
Figure 3A:
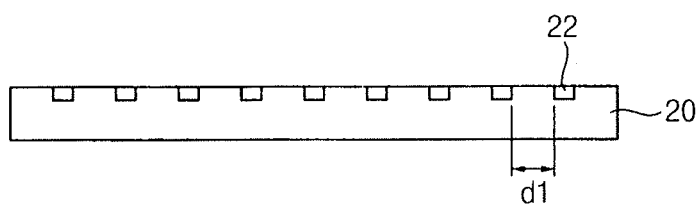
FIG. 3A illustrates a cross-sectional view of a substrate including bonding pads with a first pattern interval.
Figure 3A:
Figure 3B:
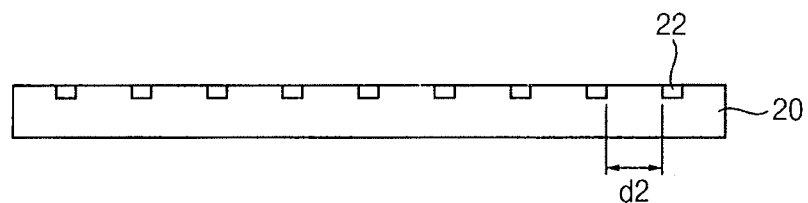
FIG. 3B illustrates a cross-sectional view of a substrate including bonding pads with a second pattern interval.
Figure 3C:
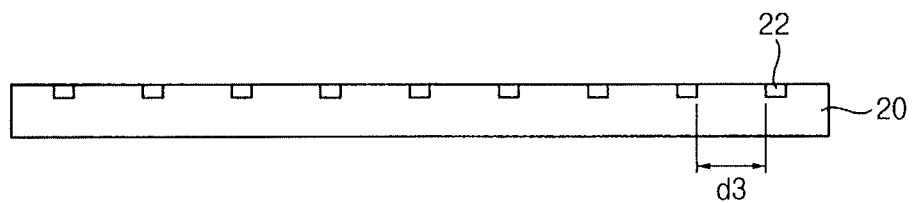
FIG. 3C illustrates a cross-sectional view of a substrate including bonding pads with a third pattern interval.
Figure 4:
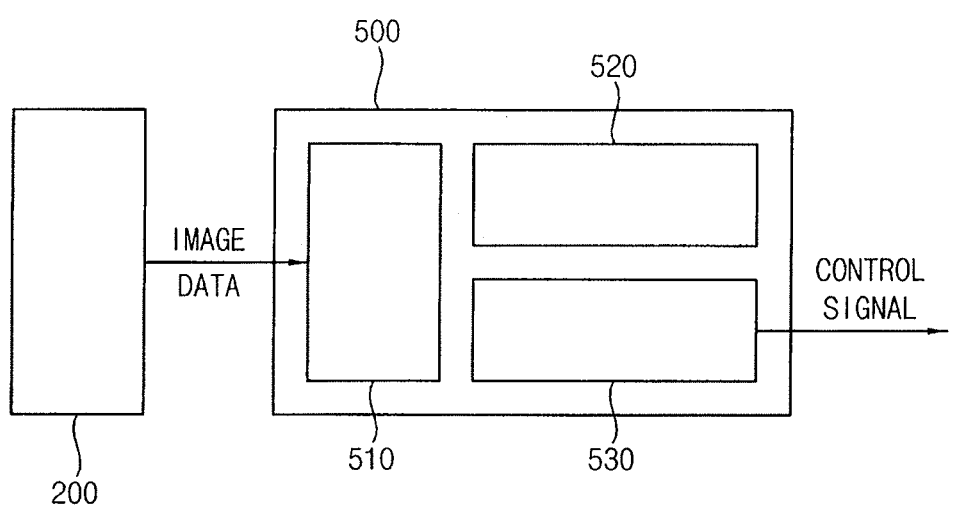
FIG. 4 illustrates a block diagram of a controller of the solder member mounting system in FIG. 1.
Figure 5:
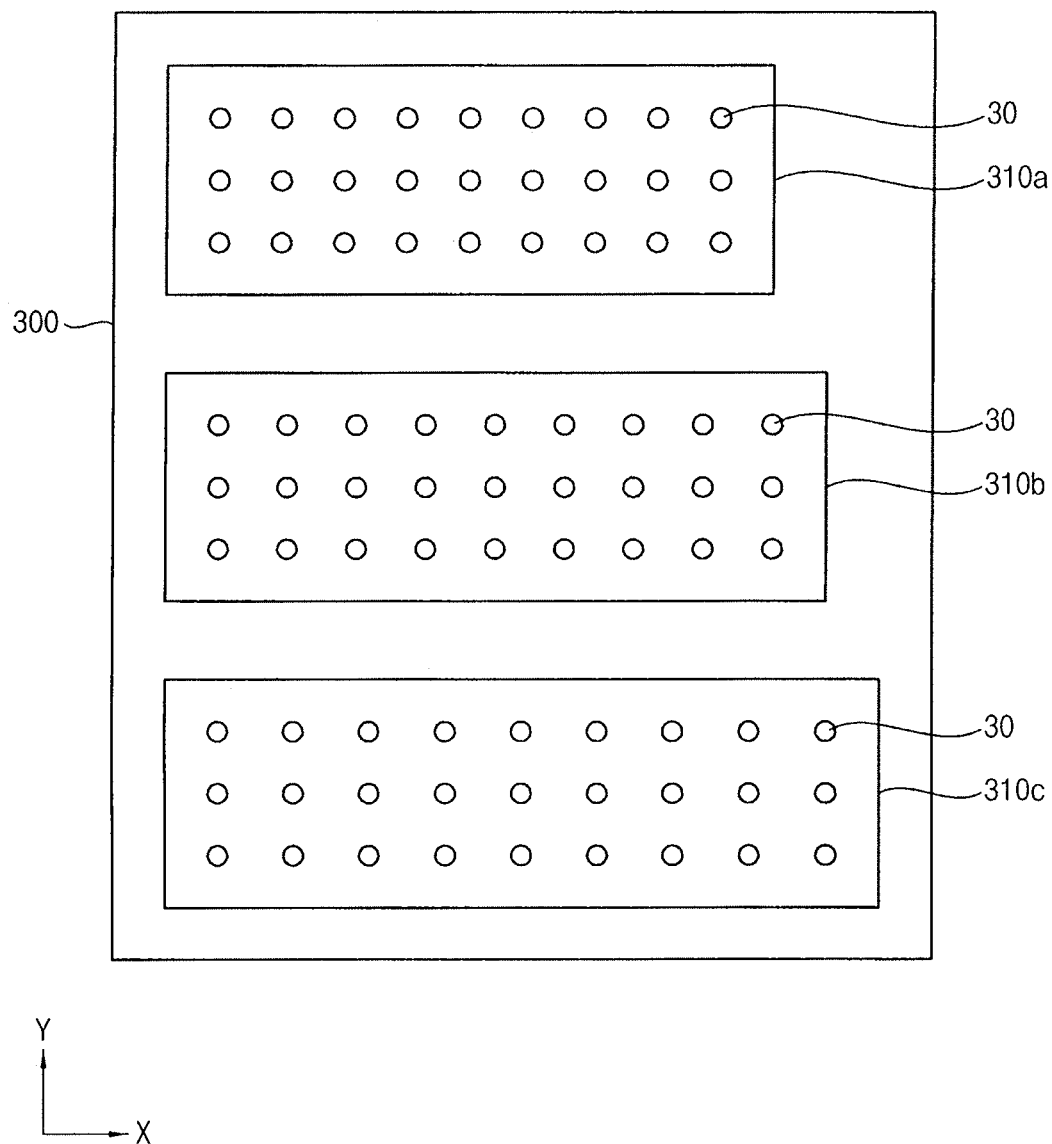
FIG. 5 illustrates a plan view of a flux coating apparatus of the solder member mounting system in FIG. 1.
Figure 6A:
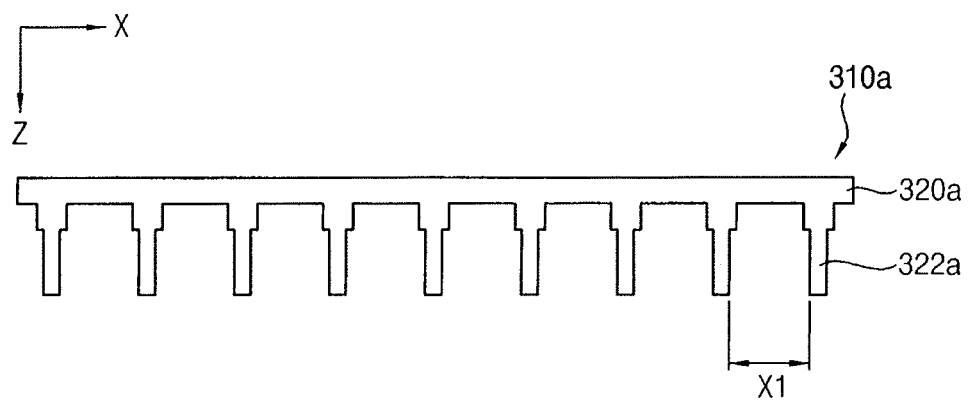
FIG. 6A illustrates a cross-sectional view of a first flux coater of the flux coating apparatus in FIG. 5.
Figure 6B:
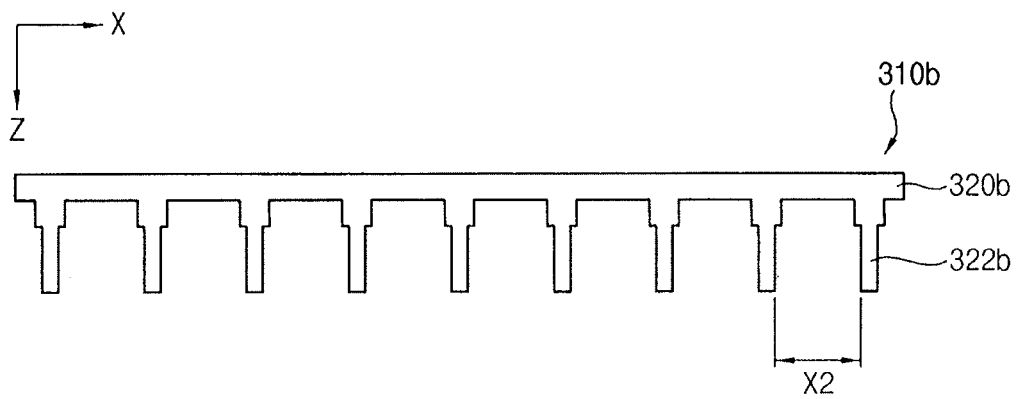
FIG. 6B illustrates a cross-sectional view of a second flux coater of the flux coating apparatus in FIG. 5.
Figure 6C:
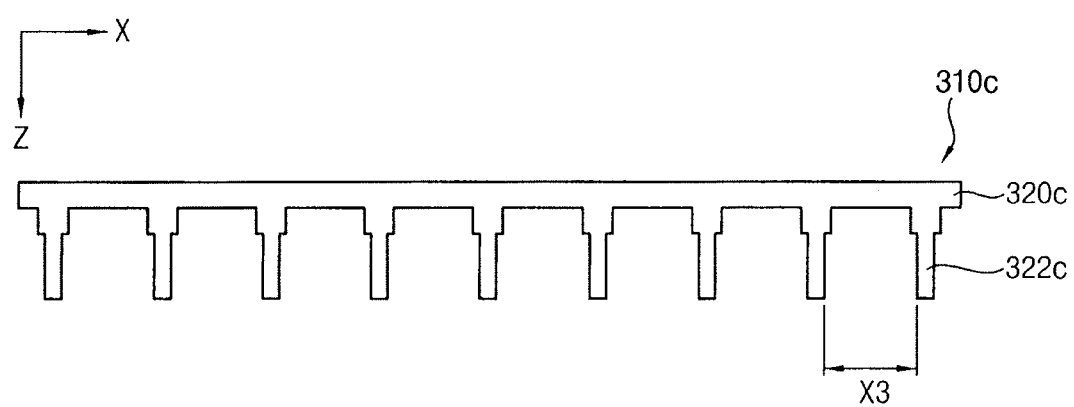
FIG. 6C illustrates a cross-sectional view of a third flux coater of the flux coating apparatus in FIG. 5.
Figure 7:
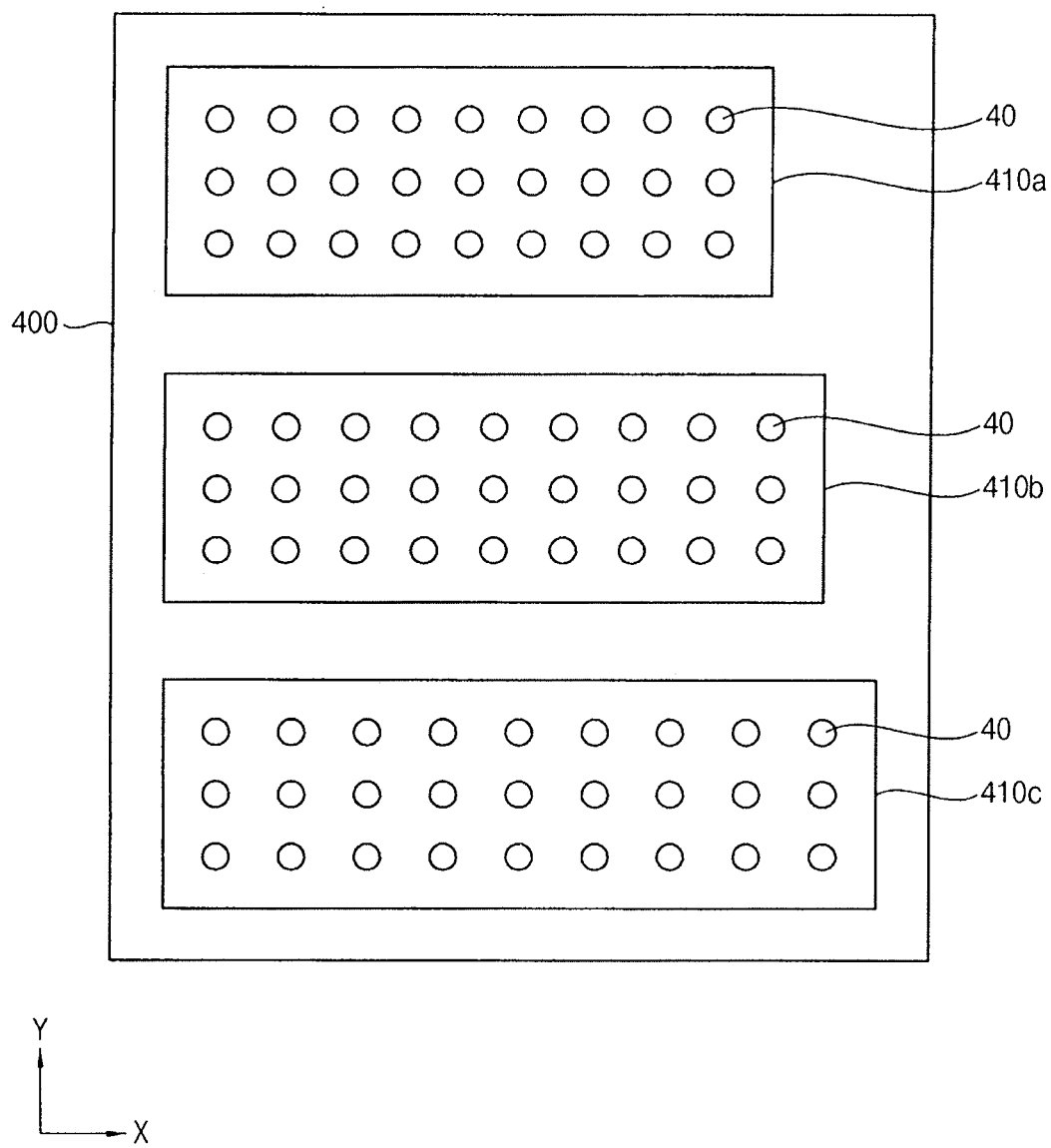
FIG. 7 illustrates a plan view of a solder member attaching apparatus of the solder member mounting system in FIG. 1.
Figure 8A:
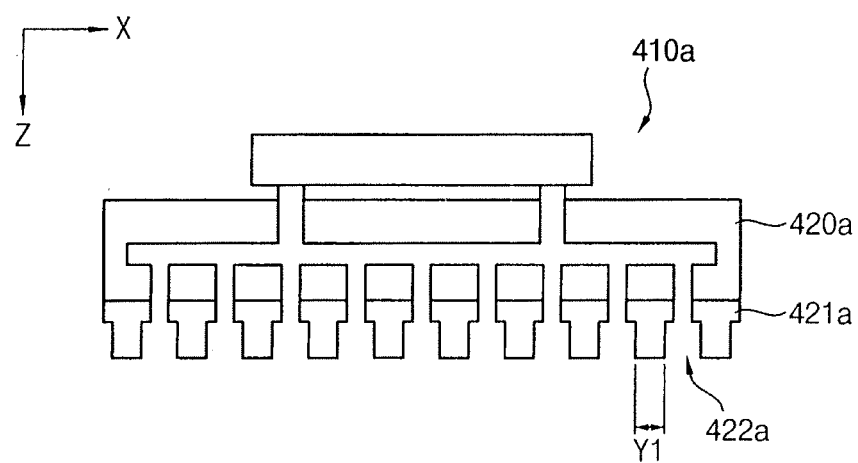
FIG. 8A illustrates a cross-sectional view of a first solder member attacher of the solder member attaching apparatus in FIG. 7.
Figure 8B:
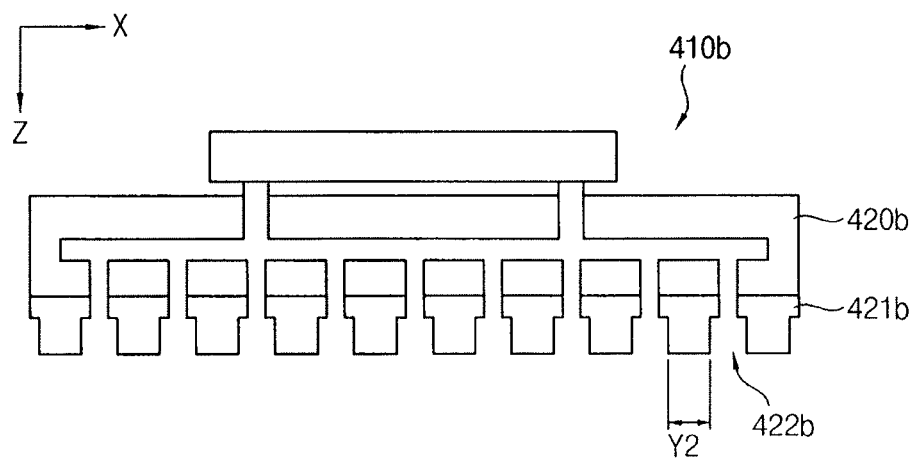
FIG. 8B illustrates a cross-sectional view of a second solder member attacher of the solder member attaching apparatus in FIG. 7.
Figure 8C:
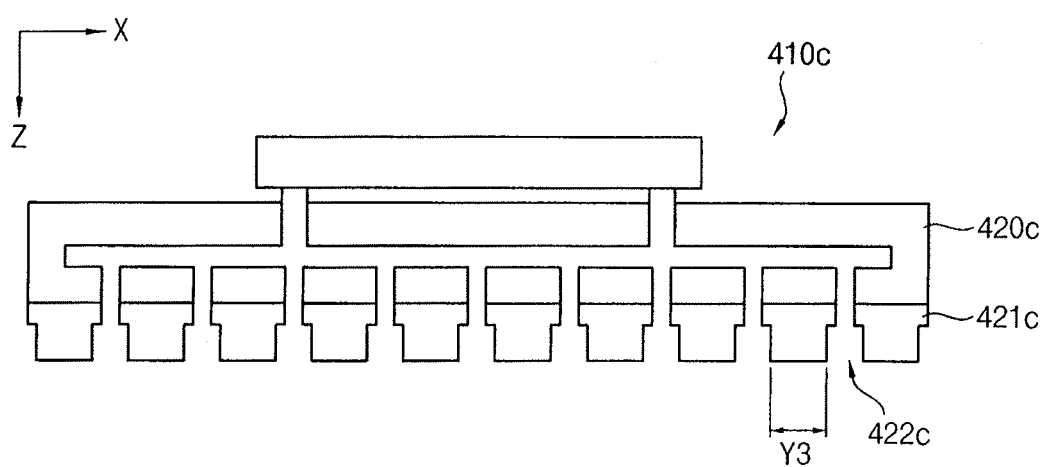
FIG. 8C illustrates a cross-sectional view of a third solder member attacher of the solder member attaching apparatus in FIG. 7.

FIG. 1 is a block diagram illustrating a solder member mounting system in accordance with example embodiments. FIG. 2 is a plan view illustrating a substrate including bonding pads on which solder members are mounted by the solder member mounting system in FIG. 1. FIG. 3A is a cross-sectional view illustrating a substrate including bonding pads with a first pattern interval. FIG. 3B is a cross-sectional view illustrating a substrate including bonding pads with a second pattern interval. FIG. 3C is a cross-sectional view illustrating a substrate including bonding pads with a third pattern interval. FIG. 4 is a block diagram illustrating a controller of the solder member mounting system in FIG. 1. FIG. 5 is a plan view illustrating a flux coating apparatus of the solder member mounting system in FIG. 1. FIG. 6A is a cross-sectional view illustrating a first flux coater of the flux coating apparatus in FIG. 5. FIG. 6B is a cross-sectional view illustrating a second flux coater of the flux coating apparatus in FIG. 5. FIG. 6C is a cross-sectional view illustrating a third flux coater of the flux coating apparatus in FIG. 5. FIG. 7 is a plan view illustrating a solder member attaching apparatus of the solder member mounting system in FIG. 1. FIG. 8A is a cross-sectional view illustrating a first solder member attacher of the solder member attaching apparatus in FIG. 7. FIG. 8B is a cross-sectional view illustrating a second solder member attacher of the solder member attaching apparatus in FIG. 7. FIG. 8C is a cross-sectional view illustrating a third solder member attacher of the solder member attaching apparatus in FIG. 7.

Referring to FIGS. 1 to 8, a solder member mounting system 10 may include a substrate transferring stage 100, a pattern recognition apparatus 200, a flux coating apparatus 300, a solder member attaching apparatus 400, and a controller 500.

In example embodiments, the solder member mounting system 10 may be configured to mount solder members, e.g., solder balls, on bonding pads 22 on a surface of a substrate 20 at once, e.g., to mount simultaneously a plurality of solder members on the substrate 20. The solder member mounting system 10 may be configured to mount an electronic product on the substrate 20 with the solder balls interposed therebetween. For example, the substrate 20 may include a package substrate, e.g., a printed circuit board (PCB), a semiconductor chip, an interposer, etc. The bonding pads 22, on which the solder members are attached, may be formed on the surface of the substrate 20.

The solder member mounting system 10 may include a main frame 12 configured to support fixedly the substrate transferring stage 100, the pattern recognition apparatus 200, the flux coating apparatus 300, and the solder member attaching apparatus 400. The main frame 12 may include a guide rail along which the substrate transferring stage 100 moves in a horizontal direction and a vertical direction.

The substrate transferring stage 100 may include a substrate support to support the substrate 20 and a driving unit 110 (see FIG. 13) to elevate the substrate support. A vacuum suction part for holding the substrate 20 may be provided in the substrate support. The driving unit 110 may include a translation driving portion and/or a rotation driving portion for precise position control of the substrate 20.

The substrate 20 may be held on the substrate support of the substrate transferring stage 100, and then, the substrate 20 may be transferred sequentially to the pattern recognition apparatus 200, the flux coating apparatus 300, and the solder member attaching apparatus 400.

The pattern recognition apparatus 200 may include at least one vision camera for detecting a pattern interval of the bonding pads 22 of the substrate 20. The pattern recognition apparatus 200 may provide a pattern recognition system for recognition of the pattern interval of the bonding pads 22 through the vision camera. The pattern interval of the bonding pads 22 of the substrate 20 may be changed due to manufacture tolerance distribution and contraction and expansion of the substrate occurring through thermal processes.

As illustrated in FIG. 3A, the bonding pads 22 may have a first pattern interval. The bonding pads 22 with the first pattern interval may be spaced apart from each other by a first distance d1, e.g., along the X direction and along the Y direction. A first allowable error range may be determined such that the first pattern interval of the bonding pads 22 falls within the first allowable error range to prevent soldering failure where the solder member deviates from the bonding pad.

As illustrated in FIG. 3B, the bonding pads 22 may have a second pattern interval greater than the first pattern interval. The bonding pads 22 with the second pattern interval may be spaced apart from each other by a second distance d2 greater than the first distance d1. A second allowable error range may be determined such that the second pattern interval of the bonding pads 22 falls within the second allowable error range to prevent soldering failure of the solder member.

As illustrated in FIG. 3C, the bonding pads 22 may have a third pattern interval greater than the second pattern interval. The bonding pads 22 with the third pattern interval may be spaced apart from each other by a third distance d3 greater than the second distance d2. A third allowable error range may be determined such that the third pattern interval of the bonding pads 22 falls within the third allowable error range to prevent soldering failure of the solder member.

For example, in case that a standard pattern interval is 100, when the first pattern interval is 93, the first pattern interval may fall within the first allowable error range of from 85 to 95. When the second pattern interval is 97, the second pattern interval may fall within the second allowable error range of from 95 to 105. When the third pattern interval is 112, the third pattern interval may fall within the third allowable error range for from 105 to 115.

The first to third allowable error ranges may be determined by any suitable method in consideration of sizes of the bonding pads, spacing between the bonding pads, size of the solder member, etc. The number, size, etc. of the allowable error ranges may be determined in consideration of the spacing between the bonding pads, coefficient of thermal expansion of the substrate, etc. The numbers of flux coaters and solder member attachers as described later may be determined based on the number of the determined allowable error ranges.

As illustrated in FIGS. 5 to 6C, the flux coating apparatus 300 may include a plurality of flux coaters, e.g., first to third flux coaters 310a, 310b, 310c. The first to third flux coaters 310a, 310b, 310c may have first to third flux pattern intervals corresponding to the first to third allowable error ranges respectively, and may coat, e.g., dot, flux 30 on bonding pads 22 of the substrate 20 before attaching solder balls thereon.

In FIG. 5, dots of flux 30 correspond to bottoms of the dotting pins, respectively, in respective flux coaters in FIGS. 6A-6C.

As illustrated in FIGS. 5 and 6A, the first flux coater 310a may include a first body 320a and a plurality of first dotting pins 322a extending in a direction from the first body 320a. For example, as illustrated in FIGS. 5 and 6A, the plurality of first dotting pins 322a may be arranged at equal intervals along the Y direction and the X direction, e.g., in a matrix pattern, and may extend along the Z direction from the first body 320a. The first dotting pins 322a of the first flux coater 310a may move to a flux reservoir and dip into flux with end portions of the first dotting pins 322a, and may dot the flux onto the bonding pads 22 of the substrate 20. The first dotting pins 322a of the first flux coater 310a may have a first flux pattern interval which satisfies the first allowable error range. The first dotting pins 322a of the first flux coater 310a may be spaced apart from each other by a first gap X1, e.g., along each of the Y and X directions.

As illustrated in FIGS. 5 and 6B, the second flux coater 310b may include a second body 320b and a plurality of second dotting pins 322b extending in a direction from the second body 320b. For example, as illustrated in FIG. 5, the second body 320b may be adjacent the first body 320a, e.g., along the Y direction, and may be substantially the same as the first body 320a, except that the second body 320b may be longer than the first body 320a along the X direction and/or the Y direction. The second dotting pins 322b of the second flux coater 310b may have a second flux pattern interval which satisfies the second allowable error range. The second dotting pins 322b of the second flux coater 310b may be spaced apart from each other by a second gap X2 greater than the first gap X1, e.g., along the X and/or Y directions. For example, as illustrated in FIG. 5, a total number of the second dotting pins 322b in the second flux coater 310b may be the same as that of the first dotting pins 322a in the first flux coater 310a, and the larger second gap X2 between the second dotting pins 322b accounts for the longer length of the second body 320b.

As illustrated in FIGS. 5 and 6C, the third flux coater 310c may include a third body 320c and a plurality of third dotting pins 322c extending in a direction from the third body 320c. For example, as illustrated in FIG. 5, the third body 320c may be adjacent the second body 320b, e.g., along the Y direction, and may be substantially the same as the second body 320b, except that the third body 320c may be longer than the second body 320b along the X direction and/or the Y direction. The third dotting pins 322c of the third flux coater 310c may have a third flux pattern interval which satisfies the third allowable error range. The third dotting pins 322c of the third flux coater 310c may be spaced apart from each other by a third gap X3 greater than the second gap X2, e.g., along the X and/or Y directions. For example, as illustrated in FIG. 5, a total number of the third dotting pins 322c in the third flux coater 310c may be the same as that of the first dotting pins 322a in the first flux coater 310a, and the larger third gap X3 between the third dotting pins 322c accounts for the longer length of the third body 320c.

As illustrated in FIGS. 7 to 8C, the solder member attaching apparatus 400 may include a plurality of solder member attachers, e.g., first to third solder member attachers 410a, 410b, 410c. The first to third attachers 410a, 410b, 410c have first to third solder member pattern intervals corresponding to the first to third allowable error ranges respectively. In FIG. 7, solder balls 40 correspond to bottoms of solder ball holders, respectively, in respective solder member attachers in FIGS. 8A-8C.

As illustrated in FIGS. 7 and 8A, the first solder member attacher 410a may include a first body 420a and a first solder ball holder 421a. The first body 420a may include an inner space connected to an external vacuum supply, e.g., the inner space may extend continuously along the X direction and the Y direction, and the first solder ball holder 421a may be connected to, e.g., a bottom of, the first body 420a. The first solder ball holder 421a may include a plurality of first holding-holes 422a therethrough, e.g., along the z direction, which are connected to the inner space of the first body 420a. A plurality of solder balls 40 may be held selectively in the plurality of first holding-holes 422a, respectively, by vacuum via the external vacuum supply. For example, a vacuum pressure may be applied to the first holding-holes 422a such that the first holding-holes 422a hold the solder balls, and the vacuum pressure may be removed from the first holding-holes 422a such that the solder balls are dropped to be attached on the bonding pads 22 of the substrate 20. The first holding-holes 422a of the first solder member attacher 410a may have a first solder member pattern interval which satisfies the first allowable error range. The first holding-holes 422a of the first solder member attacher 410a may be spaced apart from each other by a first length Y1.

As illustrated in FIGS. 7 and 8B, the second solder member attacher 410b may include a second body 420b and a second solder ball holder 421b with second holding-holes 422b. The second body 420b may be adjacent the first body 420a, e.g., along the Y direction, and may be substantially the same as the first body 420a, except that the second body 420b may be longer than the first body 420a along the X direction and/or the Y direction. The second holding-holes 422b of the second solder member attacher 410b may have a second solder member interval which satisfies the second allowable error range. The second holding-holes 422b of the second solder member attacher 410b may be spaced apart from each other by a second length Y2 greater than the first length Y1, e.g., along the X and/or Y directions. For example, as illustrated in FIG. 7, a total number of the second holding-holes 422b may be the same as that of the first holding-holes 422a.

As illustrated in FIGS. 7 and 8C, the third solder member attacher 410c may include a third body 420c and a third solder ball holder 421c with third holding-holes 422c. The third body 420c may be adjacent the second body 420b, e.g., along the Y direction, and may be substantially the same as the second body 420b, except that the third body 420c may be longer than the second body 420b along the X direction and/or the Y direction. The third holding-holes 422c of the third solder member attacher 410c may have a third solder member interval which satisfies the third allowable error range. The third holding-holes 422c of the third solder member attacher 410c may be spaced apart from each other by a third length Y3 greater than the second length Y2 e.g., along the X and/or Y directions. For example, as illustrated in FIG. 7, a total number of the third holding-holes 422c may be the same as that of the first holding-holes 422a.

As illustrated in FIG. 4, the controller 500 may include a data receiving portion 510, a storage portion 520, and an output portion 530. The data receiving portion 510 may be connected to the pattern recognition apparatus 200 to receive data, e.g., image data, from the pattern recognition apparatus 200 regarding the bonding pads 22 of the substrate 20, e.g., regarding the pattern and spacing of the bonding pads 22 on the substrate 20. The storage portion 520 may store mapping data of allowable error ranges mapped according to the pattern intervals of the bonding pads 22. The output portion 530 may determine an actual pattern interval of the bonding pads 22 from the image data and an allowable error range mapped to the determined pattern interval. The output portion 530 may output a control signal for selecting one of the first to third flux coaters 310a, 310b, 310c, and one of the first to third solder member attachers 410a, 410b, 410c corresponding to the determined allowable error range with respect to the bonding pads 22 on the substrate 20.

Referring to FIGS. 1 and 4, once an appropriate flux coater and a solder member attacher are determined by the controller 500 in accordance with information received from the pattern recognition apparatus 200 with respect to the bonding pads 22 on the substrate 20, the substrate transferring stage 100 may transfer the substrate 20 sequentially to the selected flux coater of the flux coating apparatus 300 and the selected solder member attacher of the solder member attaching apparatus 400 according to the control signal from the output portion 530 of the controller 500. The flux coating apparatus 300 may dot the flux 30 on the bonding pads 22 of the substrate 20 using the one selected from the first to third flux coaters 310a, 310b, 310c according to the control signal. Next, the solder member attaching apparatus 400 may attach the solder balls 40 on the bonding pads 22 of the substrate 20 using one selected from the first to third solder member attachers 410a, 410b, 410c.

As mentioned above, the solder member mounting system 10 may include the pattern recognition apparatus 200 to recognize the actual pattern interval of the bonding pads 22 of the substrate 20, which varies according to thermal processes previously performed on the substrate 20. The solder member mounting system 10 may predict different pattern intervals and may include a plurality of the flux coaters 310a, 310b, 310c corresponding to the different pattern intervals and a plurality of the solder member attachers 410a, 410b, 410c corresponding to the different pattern intervals. One of the flux coaters 310a, 310b, 310c corresponding to the actual pattern interval may be selected and one of the solder member attachers 410a, 410b, 410c corresponding to the actual pattern interval may be selected. Accordingly, solder balls may be attached at desired positions on the bonding pads 22 of the substrate 20, thereby preventing solder ball mounting failure where the solder balls deviate from the respective bonding pads.

Hereinafter, a method of mounting solder members using the solder member mounting system in FIG. 1 will be explained.

Figure 9:
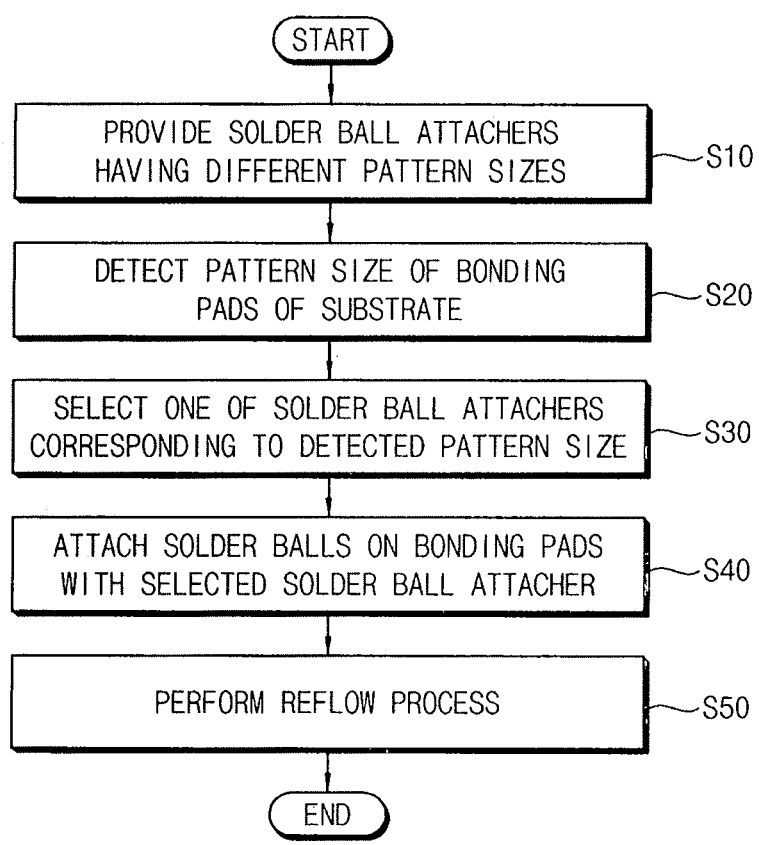
FIG. 9 illustrates a flow chart of a solder member mounting method in accordance with example embodiments.

FIG. 9 is a flow chart illustrating a solder member mounting method in accordance with example embodiments. FIGS. 10 to 15 are views illustrating the solder member mounting method in FIG. 9.

Figure 10:
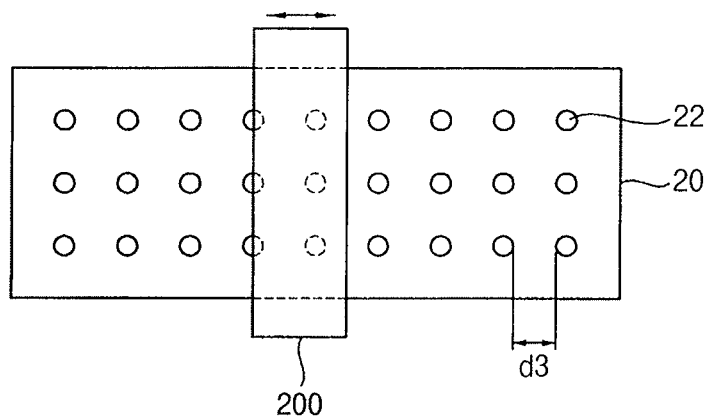
FIGS. 10 to 15 illustrate views of stages in the solder member mounting method in FIG. 9.

Referring to FIGS. 1, 9 and 10, the solder member mounting system 10 including the flux coating apparatus 300 having the first to third flux coaters 310a, 310b, 310c with respective pattern intervals and the solder member attaching apparatus 400 having the first to third solder member attachers 410a, 410b, 410c with respective pattern intervals may be prepared (S10). It is noted that while the flux coating apparatus 300 is illustrated to include three flux coaters, and the solder member attaching apparatus 400 is illustrated to include three solder member attachers, example embodiments are not limited thereto and may include more than three of each of the flux coaters and the solder member attachers.

Then, the substrate 20 may be loaded on the substrate transferring stage 100 of the solder member mounting system 10, and an actual pattern interval of the bonding pads 22 of the substrate 20 may be detected (S20). That is, the substrate 20 may be loaded onto the substrate support of the substrate transferring stage 100, and the pattern recognition apparatus 200 may be used to determine the pattern interval of the bonding pads 22 of the substrate 20.

In detail, a vacuum suction part for holding the substrate 20 may be provided in the substrate support. For example, the substrate 20 may include a printed circuit board (PCB), a semiconductor chip, an interposer, etc. The bonding pads 22, on which the solder members are to be attached, may be formed on a surface of the substrate 20.

A vision camera of the pattern recognition apparatus 200 may move along an extending direction of the substrate 20 to photograph the bonding pads 22 of the substrate 20, and transmit the photographed image data to the controller 500. For example, as illustrated in FIG. 10, the pattern recognition apparatus 200 may extend along an entire short side of the substrate 20, and may move along a longitudinal direction of the substrate 20 (along arrow in FIG. 10) to photograph the entire surface of the substrate 20 that includes the pads 22 and faces the pattern recognition apparatus 200.

As discussed previously with reference to FIG. 4, once the image data, e.g., photographs of the pads 22 on the substrate 20, are transferred to and analyzed by the controller 500 to detect the pattern interval of the pads 22, one of the plurality of the flux coaters 310a, 310b, 310c corresponding to the detected pattern interval may be selected and one of the plurality of the solder member attachers 410a, 410b, 410c corresponding to the detected pattern interval may be selected (S30). Once one of the plurality of the flux coaters 310a, 310b, 310c corresponding to the detected pattern interval is selected, as discussed previously with reference to FIGS. 5 and 6A-6C, the substrate 20 with the pads 22 is transferred to the selected flux coater, and flux may be dotted on the bonding pads 22 of the substrate 20.

Next, as discussed previously with reference to FIGS. 7 and 8A-8C, the substrate 20 with the pads 22 is transferred to the selected solder member attacher, and solder balls may be attached on the bonding pads 22 of the substrate 20 using the selected solder member attacher (S40). Then, a solder reflow process may be performed on the substrate 20 to form a solder bump (S50).

In example embodiments, the bonding pads 22 of the substrate 20 may have a pattern interval due to thermal history. The controller 500 may determine a plurality of allowable error ranges corresponding to different pattern intervals which are predicted by thermal expansion and thermal contraction of the substrate 20. For example, first to third allowable error ranges may be determined. In case that a standard pattern interval is 100, the first allowable error range may be from 85 to 95, the second allowable error range may be from 95 to 105, and the third allowable error range may be from 105 to 115.

For example, as illustrated in FIG. 10, the bonding pads 22 of the substrate 20 may have a third pattern interval which falls within the third allowable error range. In this case, flux may be coated on the bonding pads 22 of the substrate 20 using the third flux coater 310c having the third flux pattern interval corresponding to the third allowable error range.

Figure 11:
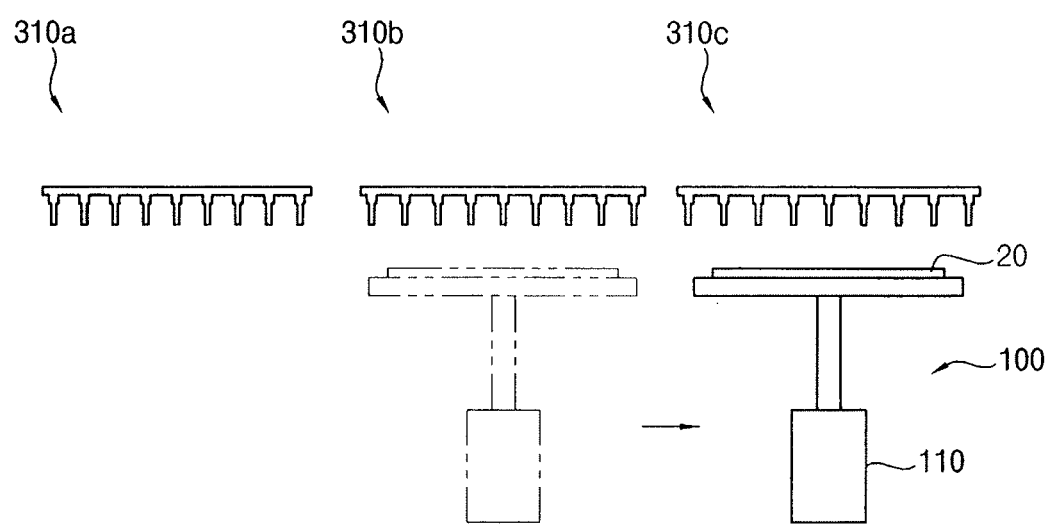
Figure 12:
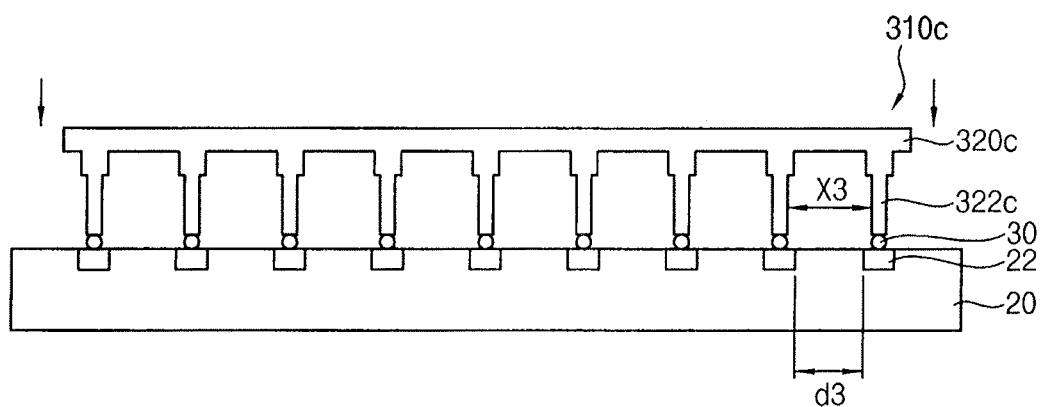

In detail, as illustrated in FIG. 11, the substrate 20 may be transferred to the third flux coater 310c of the flux coating apparatus 300 (along the arrow in FIG. 11). Next, as illustrated in FIG. 12, the third body 320c of the third flux coater 310c may be lowered toward the substrate 20 (along the arrow in FIG. 12), and the flux 30 may be dotted on the bonding pads 22 of the substrate 20 by the third dotting pins 322c of the third flux coater 310c. As illustrated in FIG. 12, the third gap X3 between the third dotting pins 322c corresponds to the third distance d3 between the pads 22, so the third dotting pins 322c and the pads 22 are aligned.

Figure 13:
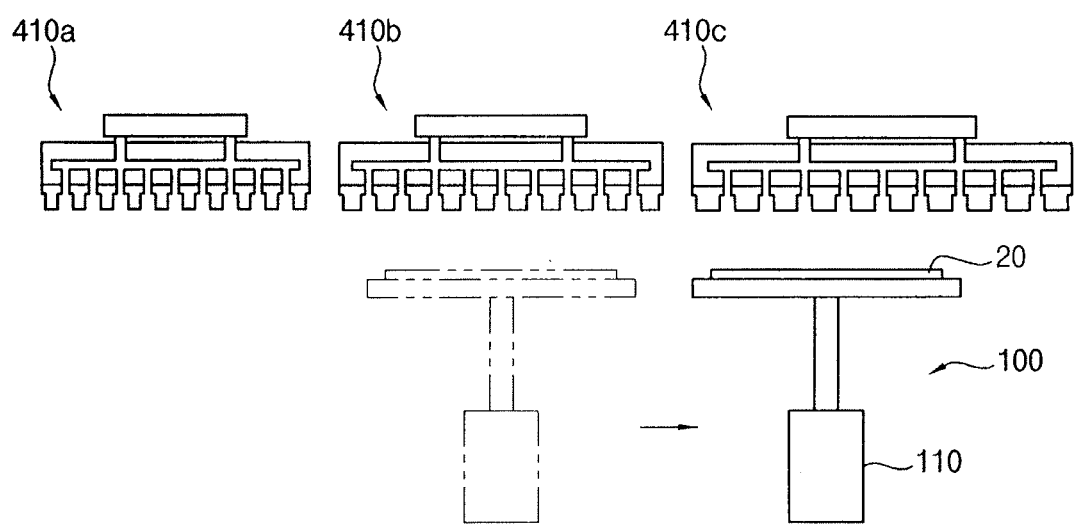

Then, as illustrated in FIG. 13, the substrate 20 may be transferred to the third solder member attacher 410c of the solder member attaching apparatus 400, so the solder balls 40 may be attached on the bonding pads 22 of the substrate 20 using the third solder member attacher 410c having a third solder member pattern interval corresponding to the third allowable error range.

Figure 14:
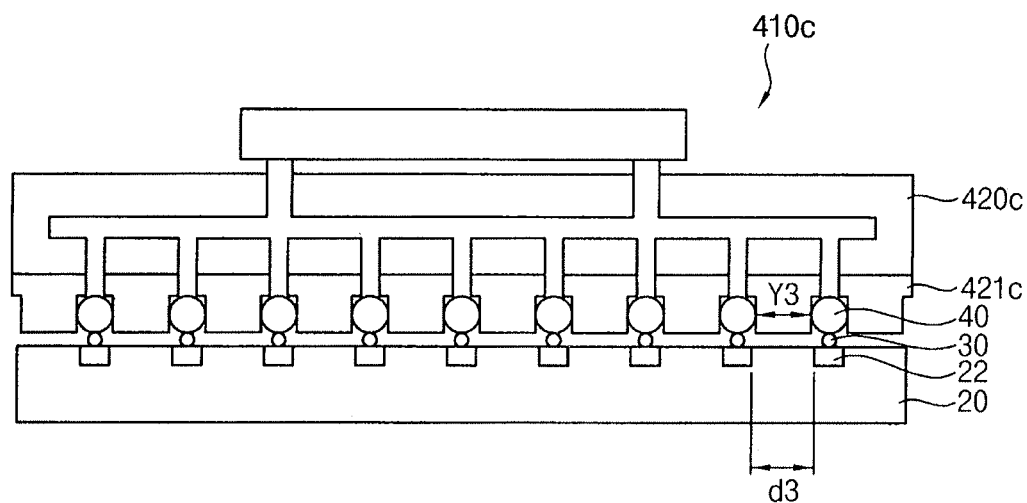

As illustrated in FIG. 14, the third holding-holes 422c of the third solder member attacher 410c may hold and place the solder balls 40 on the bonding pads 22 of the substrate 20 in a vacuum suction manner. The third length Y3 between the third holding-holes 422c corresponds to the third distance d3 between the pads 22, so the third holding-holes 422c and the pads 22 are aligned.

Figure 15:
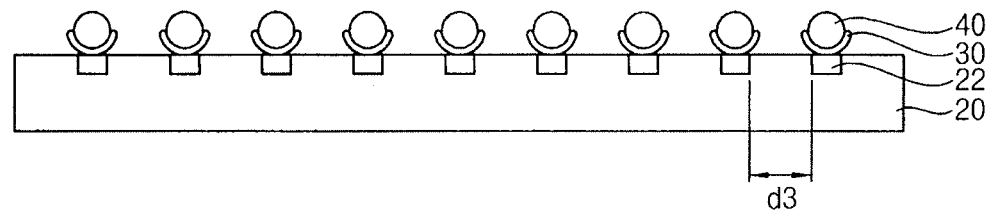

Thus, as illustrated in FIG. 15, the flux 30 and the solder ball 40 may be stacked sequentially on the bonding pad 22 of the substrate 20. Then, the solder reflow process may be performed on the substrate 20 to form the solder bump (S50).

In the reflow process, in example embodiments, the substrate 20 may be transferred to a heating chamber of a solder reflow apparatus, and then, the solder ball may be heated to form the solder bump on the bonding pad 22 of the substrate 20. The flux 30 may be selectively heated by the solder reflow apparatus and the solder ball 40 may be molten to form the solder bump.

In this case, an electronic product may be mounted on the substrate 20 with the solder balls 40 interposed therebetween. Thus, the substrate 20 and the electronic product may be connected mechanically and electrically to each other.

Figure 16A:
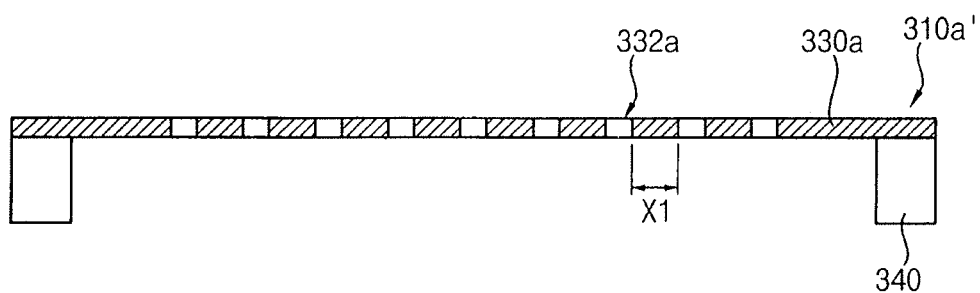
FIGS. 16A to 16C illustrate cross-sectional views of first to third flux coaters of a flux coating apparatus of a solder member mounting system in accordance with example embodiments.
Figure 16B:
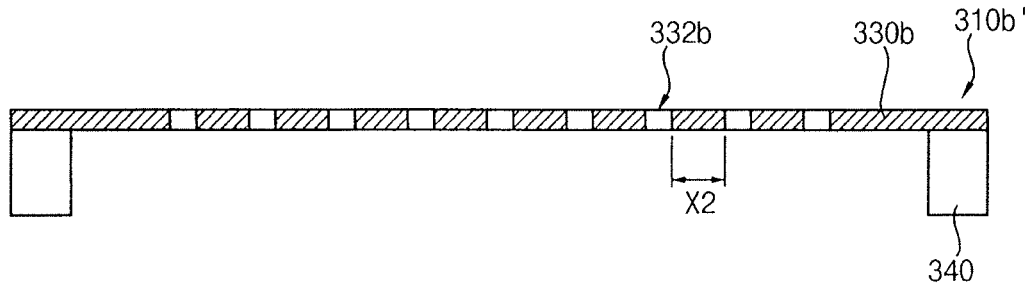
Figure 16C:
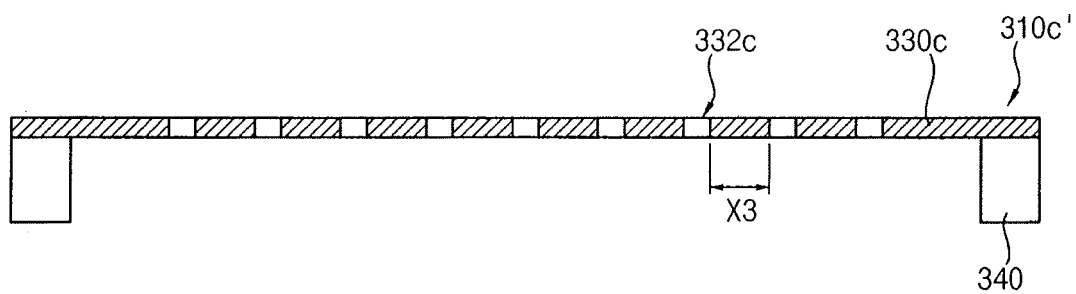
Figure 17A:
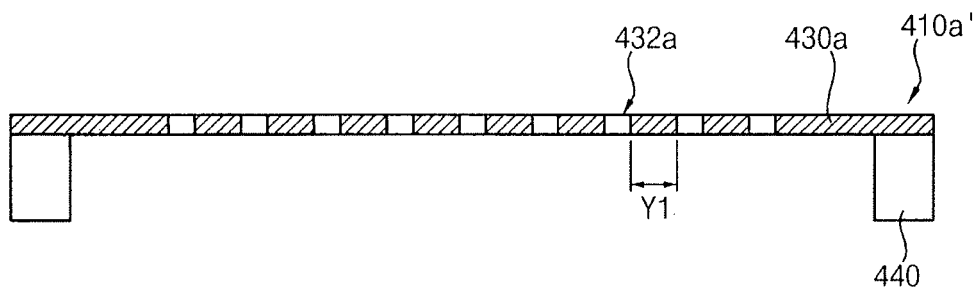
FIGS. 17A to 17C illustrate cross-sectional views of first to third solder member attachers of a solder member mounting system in accordance with example embodiments.
Figure 17B:
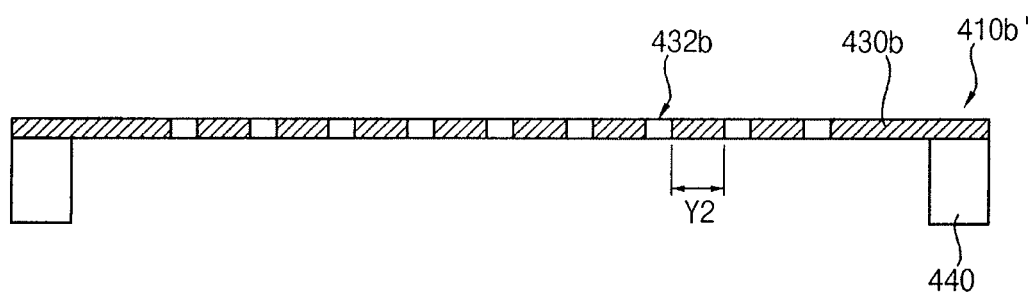
Figure 17C:
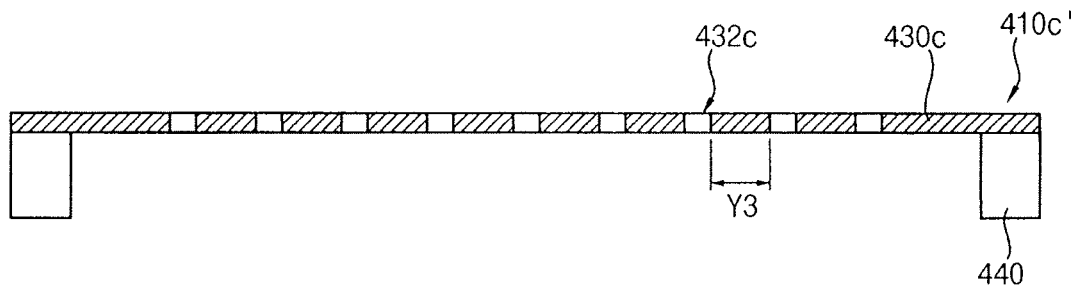

FIGS. 16A to 16C are cross-sectional views illustrating first to third flux coaters of a flux coating apparatus of a solder member mounting system in accordance with example embodiments. FIGS. 17A to 17C are cross-sectional views illustrating first to third solder member attachers of a solder member mounting system in accordance with example embodiments. The solder member mounting system may be substantially the same as or similar to the solder member mounting system described with reference to FIG. 1, except for configurations of the flux coater and the solder member attacher. Thus, same reference numerals will be used to refer to the same or like elements and any further repetitive explanation concerning the above elements will be omitted.

Referring to FIGS. 16A to 16C, a flux coating apparatus may include first to third flux coaters 310a', 310b', 310c'. The first to third flux coaters 310a', 310b', 310c' may have first to third flux pattern intervals corresponding to first to third allowable error ranges respectively.

As illustrated in FIG. 16A, the first flux coater 310a' may include a frame 340 with a first flux mask 330a having first through-holes 332a for coating flux. After the first flux mask 330a is positioned on the substrate 20, the flux may be coated on a whole upper surface of the first flux mask 330a using a screen-printing method. Then, the first flux mask 330a may be removed from the substrate 20, so a flux pattern having the first flux pattern interval may remain on the substrate 20 in accordance with the first through-holes 332a. The first through-holes 332a of the first flux coater 310a' may have the first flux pattern interval which satisfies the first allowable error range. The first through-holes 332a of the first flux coater 310a' may be spaced apart from each other by the first gap X1.

As illustrated in FIG. 16B, the second flux coater 310b' may include a second flux mask 330b having second through-holes 332b for coating flux. The second through-holes 332b of the second flux coater 310b' may have the second flux pattern interval which satisfies the second allowable error range. The second through-holes 332b of the second flux coater 310b' may be spaced apart from each other by the second gap X2 greater than the first gap X1.

As illustrated in FIG. 16C, the third flux coater 310c' may include a third flux mask 330c having third through-holes 332c for coating flux. The third through-holes 332c of the third flux coater 310c' may have the third flux pattern interval which satisfies the third allowable error range. The third through-holes 332c of the third flux coater 310c' may be spaced apart from each other by the third gap X3 greater than the second gap X2.

Referring to FIGS. 17A to 17C, a solder member attaching apparatus may include first to third solder member attachers 410a', 410b', 410c'. The first to third solder member attachers 410a', 410b', 410c' may have first to third solder member pattern intervals corresponding to the first to third allowable error ranges.

As illustrated in FIG. 17A, the first solder member attacher 410a' may include a frame 440 with a first ball mask 430 having first holes 432a for passing solder balls therethrough. After the first ball mask 430a is positioned on the substrate 20, the solder balls may be moved into the first holes 432a of the first ball mask 430a using a brush. Then, the first ball mask 430a may be removed from the substrate 20 to attach a solder ball pattern having the first solder ball pattern interval on the substrate 20. The first holes 432a of the first solder member attacher' 410a may have the first solder member pattern interval which satisfies the first allowable error range. The first holes 432a of the first solder member attacher 410a' may be spaced apart from each other by a first length Y1.

As illustrated in FIG. 17B, the second solder member attacher 410b' may include a second ball mask 430b having second holes 432b for passing solder balls therethrough. The second holes 432b of the second solder member attacher 410b' may have the second solder member pattern interval which satisfies the second allowable error range. The second holes 432b of the second solder member attacher 410b' may be spaced apart from each other by a second length Y2 greater than the first length Y1.

As illustrated in FIG. 17C, the third solder member attacher 410c' may include a third ball mask 430c having third holes 432c for passing solder balls therethrough. The third holes 432c of the third solder member attacher 410c' may have the third solder member pattern interval which satisfies the third allowable error range. The third holes 432c of the third solder member attacher 410c' may be spaced apart from each other by a third length Y3 greater than the second length Y2.

Hereinafter, a method of mounting solder members using the solder member mounting system including the flux coating apparatus in FIGS. 16A to 16C and the solder member attaching apparatus in FIGS. 17A to 17C will be explained.

FIGS. 18 to 22 are views illustrating a solder member mounting method in accordance with example embodiments.

Figure 18:
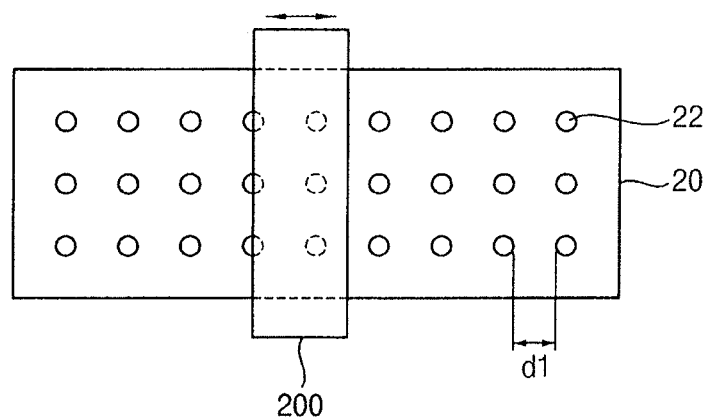
FIGS. 18 to 22 illustrate views of a solder member mounting method in accordance with example embodiments.

Referring to FIGS. 1 and 18, the substrate 20 may be loaded on the substrate transferring stage 100 of the solder member mounting system 10. Then, an actual pattern interval of the bonding pads 22 may be detected.

In detail, referring to FIG. 18, a vision camera of the pattern recognition apparatus 200 may move along an extending direction of the substrate 20 to photograph the bonding pads 22 of the substrate 20, and may transmit the photographed image data to the controller 500. In example embodiments, the bonding pads 22 of the substrate 20 may have a pattern interval due to thermal history. The controller 500 may determine a plurality of allowable error ranges corresponding to different pattern intervals which are predicted by thermal expansion and thermal contraction of the substrate 20.

For example, first to third allowable error ranges may be determined. In case that a standard pattern interval is 100, the first allowable error range may be from 85 to 95, the second allowable error range may be from 95 to 105, and the third allowable error range may be from 105 to 115.

As illustrated in FIG. 18, the bonding pads 22 of the substrate 20 may have the first pattern interval which falls within the first allowable error range. In this case, flux may be coated on the bonding pads 22 of the substrate 20 using the first flux coater 310a' having the first flux pattern interval corresponding to the first allowable error range.

Figure 19:
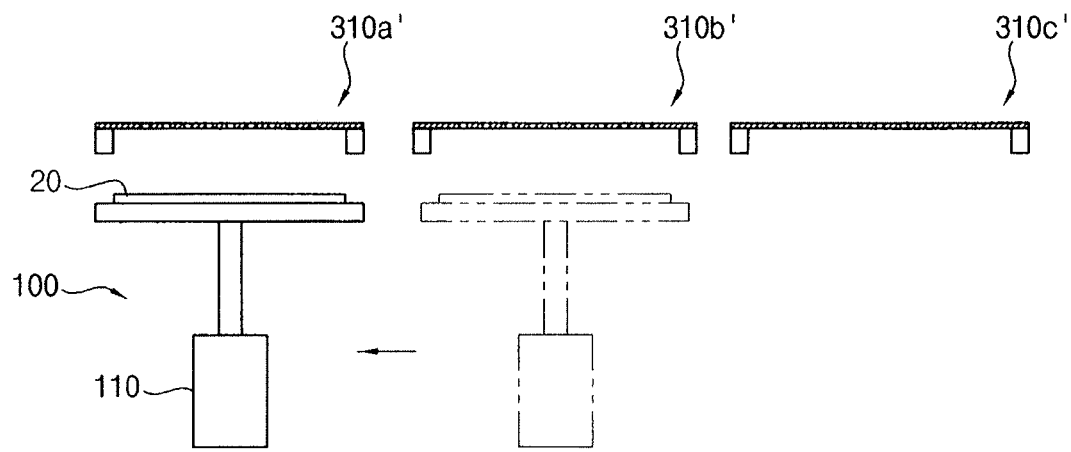
Figure 20:
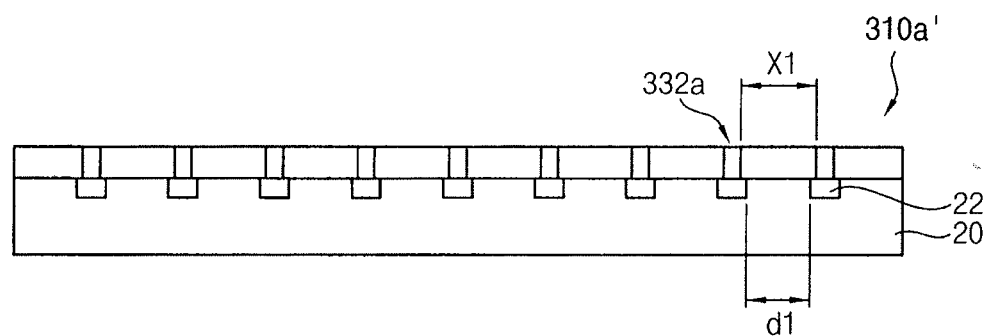

For example, as illustrated in FIGS. 19 and 20, the substrate 20 may be transferred to the first flux coater 310a' of the flux coating apparatus 300. The first flux mask 330a may be positioned on the substrate 20. Then, the flux may be coated on a whole upper surface of the first flux mask 330a using a screen-printing method. Then, the first flux mask 330a may be removed from the substrate 20 to form a flux pattern having the first flux pattern interval on the substrate 20.

Figure 21:
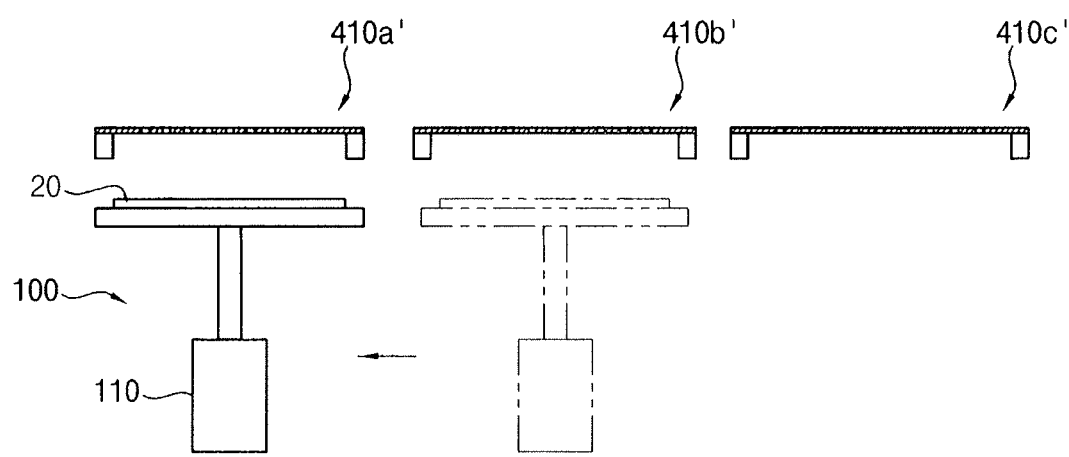
Figure 22:
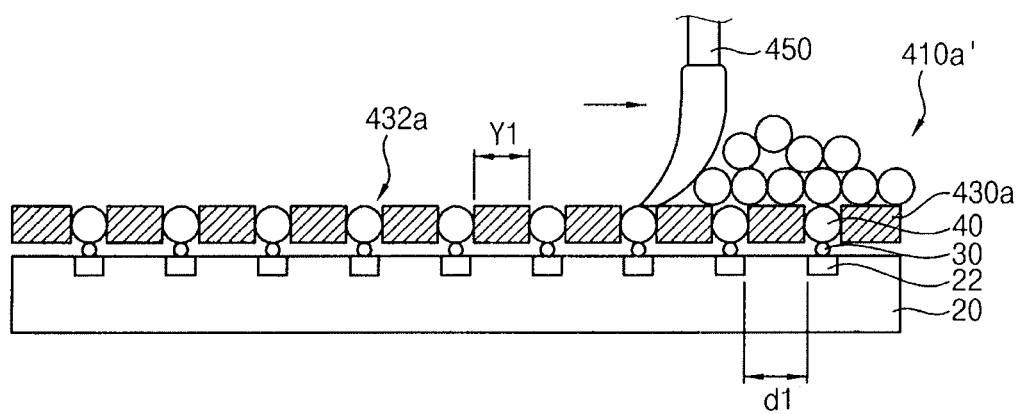

Then, solder balls 40 may be attached on the bonding pads 22 of the substrate 20 using the first solder member attacher 410a' having a first solder member pattern interval corresponding to the first allowable error range. That is, as illustrated in FIGS. 21 and 22, the substrate 20 may be transferred to the first solder member attacher 410a' of the solder member attaching apparatus 400. After the first ball mask 430a is positioned on the substrate 20, the solder balls 40 may be moved into first holes 432a of the first ball mask 430a using a brush 450 (FIG. 22), and the first ball mask 430a may be removed from the substrate 20 to attach a solder ball pattern having the first solder ball pattern interval on the substrate 20. Instead of using the brush, vacuum pressure may be applied to a vacuum holder provided in the solder member attaching apparatus 400 to hold the solder balls 40, followed by removal of the vacuum pressure from the first holes 432a and spraying air out to move the solder balls 40 into the respective first holes 432a, or a cyclone may be used to move the solder balls 40 into the respective first holes 432a. Then, a solder reflow process may be performed on the substrate 20 to mount the solder balls 40 on the bonding pads 22 of the substrate 20.

In example embodiments, the solder member attaching apparatus 400 may be included in the solder member mounting system 10, and the flux coating apparatus 300 may be omitted. In this case, the solder member attaching apparatus 400 may include first to third paste coaters for coating solder paste. The first to third paste coaters may have first to third solder paste pattern intervals corresponding to first to third allowable error ranges respectively.

For example, each of the first to third paste coaters may include a paste mask having openings for coating the solder paste. After the paste mask is positioned on the substrate 20, the solder paste may be printed on the bonding pads 22 of the substrate 20 through the openings of the paste mask.

The above-mentioned method may be iterated to manufacture semiconductor packages including logic devices and memory devices and semiconductor modules including the same. For example, the semiconductor package may include logic devices, e.g., central processing units (CPUs), main processing units (MPUs), or application processors (APs), or the like, and volatile memory devices, e.g., dynamic random access memory (DRAM) devices, static random access memory (SRAM) devices, or non-volatile memory devices, e.g., flash memory devices, phase change random access memory (PRAM) devices, magnetoresistive random access memory (MRAM) devices, resistive random access memory (ReRAM) devices, or the like.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The calculation units, control units, and other processing features of the disclosed embodiments may be implemented in logic which, for example, may include hardware, software, or both. When implemented at least partially in hardware, the calculation units, control units, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the calculation units, control units, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

By way of summation and review, when solder balls are mounted on bonding pads of a substrate at once, a distance between the solder balls may not be matched with a distance between the bonding pads due to contraction and expansion of the substrate during previous processing stages, e.g., according to thermal history. Therefore, a solder ball mounting failure may be caused where the distances between the solder balls deviate from the distances between respective bonding pads.

In contrast, example embodiments provide a solder member mounting method capable of manufacturing a semiconductor package or a semiconductor module having electrical reliability. Example embodiments also provide a solder member mounting system for performing the solder member mounting method.

That is, according to example embodiments, a plurality of allowable error ranges may be determined such that an actual pattern interval of bonding pads of a substrate falls within one of the allowable error ranges. Flux coaters having different pattern intervals and solder member attachers having different pattern intervals are provided, with the different pattern intervals corresponding to the allowable error ranges respectively. The actual pattern interval of the bonding pads is detected, and flux and solder members are formed sequentially on the bonding pads of the substrate, using the flux coater and the solder member attacher having the pattern interval corresponding to the detected pattern interval. Accordingly, the solder balls may be attached at desired positions on the bonding pads of the substrate, to thereby prevent solder ball mounting failure where distances between the solder balls deviate from distances between the respective bonding pads.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A solder member mounting system, comprising:
a substrate transferring stage to transfer and support a substrate having bonding pads thereon;
a pattern recognition apparatus to detect a pattern interval of the bonding pads;
a solder member attaching apparatus including a plurality of solder member attachers having different pattern intervals from each other; and
a controller configured to select one solder member attacher of the plurality of solder member attachers, a pattern interval of the selected solder member attacher corresponding to the detected pattern interval of the bonding pads,
wherein, before selecting one of the plurality of solder member attachers and before attaching solder members on the bonding pads, respectively, using the one selected solder member attacher, the controller is configured to determine a plurality of allowable error ranges, in accordance with the detected pattern interval of the bonding pads, such that the detected pattern interval of the bonding pads falls within one of the allowable error ranges.

2. The solder member mounting system as claimed in claim 1, wherein the selected solder member attacher is configured to attach solder balls on the bonding pads in a vacuum suction manner.

3. The solder member mounting system as claimed in claim 1, wherein the solder member attacher includes a ball mask having through-holes therein.

4. The solder member mounting system as claimed in claim 1, wherein the solder member attacher includes a paste mask having through-holes.

5. The solder member mounting system as claimed in claim 1, wherein the different pattern intervals of the plurality of solder member attachers correspond to the plurality of allowable error ranges, respectively.

6. The solder member mounting system as claimed in claim 1, wherein the controller is configured to determine the pattern interval of the bonding pads from an image data of the bonding pads, and to output a control signal for selecting one of the plurality of solder member attachers in accordance with the pattern interval of the bonding pads.

7. The solder member mounting system as claimed in claim 1, further comprising a flux coating apparatus including a plurality of flux coaters having different pattern intervals from each other, after determining the plurality of allowable error ranges and before attaching the solder members on the bonding pads, the controller is configured to select one of the plurality of flux coaters, such that a pattern interval of the selected flux coater corresponds to the pattern interval of the bonding pads.

8. The solder member mounting system as claimed in claim 7, wherein the flux coater includes dotting pins.

9. The solder member mounting system as claimed in claim 7, wherein the flux coater includes a flux mask having through-holes.

10. The solder member mounting system as claimed in claim 7, wherein the different pattern intervals of the plurality of flux coaters correspond to the plurality of allowable error ranges, respectively.

* * * * *